United States Patent [19]
Chen et al.

[11] Patent Number: 6,114,071
[45] Date of Patent: *Sep. 5, 2000

[54] METHOD OF FINE FEATURE EDGE TUNING WITH OPTICALLY-HALFTONED MASK

[75] Inventors: J. Fung Chen, Cupertino; Kurt E. Wampler, Sunnyvale; Tom Laidig, Point Richmond, all of Calif.

[73] Assignee: ASML Masktools Netherlands B.V., Veldhoven, Netherlands

[*] Notice: This patent issued on a continued prosecution application filed under 37 CFR 1.53(d), and is subject to the twenty year patent term provisions of 35 U.S.C. 154(a)(2).

[21] Appl. No.: 09/055,355

[22] Filed: Apr. 6, 1998

Related U.S. Application Data

[60] Provisional application No. 60/066,396, Nov. 24, 1997.

[51] Int. Cl.[7] .................................................. G03F 9/00
[52] U.S. Cl. .................................................................. 430/5
[58] Field of Search ................................ 430/5, 22, 322

[56] References Cited

U.S. PATENT DOCUMENTS

| | | |
|---|---|---|
| 5,229,255 | 7/1993 | White ........................................ 430/311 |
| 5,242,770 | 9/1993 | Chen et al. ................................... 430/5 |
| 5,256,505 | 10/1993 | Chen et al. ................................... 430/5 |
| 5,288,569 | 2/1994 | Lin ............................................. 430/5 |
| 5,324,600 | 6/1994 | Jinbo et al. ................................... 430/5 |
| 5,362,584 | 11/1994 | Brock et al. ................................. 430/5 |
| 5,436,095 | 7/1995 | Mizuno et al. ............................... 430/5 |
| 5,447,810 | 9/1995 | Chen et al. ................................... 430/5 |
| 5,538,815 | 7/1996 | Oi et al. ....................................... 430/5 |
| 5,663,893 | 9/1997 | Wampler et al. ............................ 430/5 |
| 5,707,765 | 1/1998 | Chen ........................................... 430/5 |
| 5,723,233 | 3/1998 | Garza et al. ................................. 430/5 |
| 5,821,014 | 10/1998 | Chen et al. ................................... 430/5 |

*Primary Examiner*—S. Rosasco
*Attorney, Agent, or Firm*—McDermott, Will & Emery

[57] ABSTRACT

A photolithography mask for optically transferring a lithographic pattern corresponding to an integrated circuit from the mask onto a semiconductor substrate by use of an optical exposure tool. The mask comprises a plurality of features corresponding to elements forming the integrated circuit, and a plurality of non-resolvable biasing segments disposed on an edge of at least one of the features.

9 Claims, 6 Drawing Sheets

CD AT TOP [μm]
0.145

CD AT BOTTOM [μM]
0.179

CD AT SUBSTRATE [μm]
0.183

AVERAGE SIDEWALL ANGLE [°]
87.600

THICKNESS LOSS [%]
0.410

CD AT TOP [μm]
0.145

CD AT BOTTOM [μM]
0.180

CD AT SUBSTRATE [μm]
0.183

AVERAGE SIDEWALL ANGLE [°]
87.562

THICKNESS LOSS [%]
0.412

METHOD OF FINE FEATURE EDGE TUNING WITH OPTICALLY-HALFTONED MASK

This Application claims domestic priority to Provisional Application No. 60/066,396 filed Nov. 24, 1997.

BACKGROUND OF THE INVENTION

1. Field of the Invention

The present invention relates to photolithography and more particularly to proximity correction features used in photolithography masks used to manufacture semiconductor devices.

2. Description of the Related Art

As semiconductor manufacturing technology is quickly pushing towards the limits of optical lithography, the state-of-the-art processes to date have regularly produced ICs with features exhibiting critical dimensions ("CDs") which are below the exposure wavelength ("$\lambda$"). (A "critical dimension" of a circuit is defined as the smallest width of a feature or the smallest space between two features.) For feature patterns that are designed to be smaller than $\lambda$, it has been recognized that the optical proximity effect (OPE) becomes much more severe, and in fact becomes intolerable for leading edge sub-$\lambda$ production processes.

Optical proximity effects are a well known characteristic of optical projection exposure tools. More specifically, proximity effects occur when very closely spaced circuit patterns are lithographically transferred to a resist layer on a wafer. The light waves of the closely spaced circuit features interact, thereby distorting the final transferred pattern features. In other words, diffraction causes adjacent features to interact with each other in such a way as to produce pattern dependent variations. The magnitude of the OPE on a given feature depends on the feature's placement on the mask with respect to other features. The closer together features are to one another, the stronger the optical proximity effect between them.

One of the primary problems caused by such proximity effects is an undesirable variation in feature CDs. For any leading edge semiconductor process, achieving tight control over the CDs of the features (i.e., circuit elements and interconnects) is the number one manufacturing goal, since this has a direct impact on wafer sort yield and speed-binning of the final product.

It has been known that the variations in the CDs of circuit features caused by OPE can be reduced by several methods. One such technique involves adjusting the illumination characteristics of the exposure tool. More specifically, by carefully selecting the ratio of the numerical aperture of the illumination condenser ("NAc") to the numerical aperture of the imaging objective lens ("NAo") (this ratio has been referred to as the partial coherence ratio—$\sigma$), the degree of OPE can be manipulated to some extent. The partial coherence ratio is defined as:

$$\sigma = (NAc)/(NAo)$$

Generally speaking, as $\sigma$ increases, the illumination coherence decreases. The less coherent the illumination source, the smaller the OPE. In the extreme case, where $\sigma$ is greater than 0.7, the OPE can be substantially minimized for feature pitches ("FP") ranging from isolated to semi-isolated, as these terms are defined below. As a rule of thumb, for a modern exposure tool with NAo>0.55, feature packing is often expressed in terms of "pitch" for any two adjacent features. It is noted that for the purposes of the following description, as well as the description of the invention, feature "pitch" is subdivided into the following four categories:

a) Dense features: $FP<2\lambda$,
b) Semi-dense features: $2\lambda \leq FP<3\lambda$,
c) Semi-isolated features: $3\lambda \leq FP<5\lambda$ and
d) Isolated features: $FP \geq 5\lambda$, where, FP=feature CD+feature-to-feature space.

In addition to using relatively incoherent illumination, such as described above, OPE can also be compensated for by "pre-correcting" the mask features. This family of techniques is generally known as optical proximity correction (OPC) techniques.

For example, in U.S. Pat. No. 5,242,770 (the '770 patent), which is assigned to the assignee of the present application, the method of using scattering bars (SBs) for OPC is described. The '770 patent demonstrates that the SB method is very effective for modifying isolated features so that the features behave as if the features are dense features. In so doing, the depth of focus (DOF) for the isolated features is also improved, thereby significantly increasing process latitude. Scattering bars (also known as intensity leveling bars or assist bars) are correction features (typically non-resolvable by the exposure tool) that are placed next to isolated feature edges on a mask in order to adjust the edge intensity gradients of the isolated edges. Preferably, the adjusted edge intensity gradients of the isolated edges match the edge intensity gradients of the dense feature edges, thereby causing the SB-assisted isolated features to have the nearly the same width as densely nested features.

While "scatter bar" OPC is an effective method for matching isolated and dense features, the standard scattering bar (SSB) carries more than the required "optical weight" when used in conjunction with semi-isolated feature pitches, and results in an overcorrection if used in this context. In U.S. patent application Ser. No. 08/808,587 filed on Feb. 28, 1997 now U.S. Pat. No. 5,821,014, Applicants of the present invention describe a "feature crowding" OPC method that addresses the need to obtain more precise CD correction for semi-isolated features. The method described therein employs SBs having a lighter optical weight, thereby permitting a more accurate treatment of semi-isolated features.

More specifically, referring to FIG. 1, the "feature crowding" SB method of the Ser. No. 08/808,587 application introduces two new classes of scattering bar: a thin SB 12 ("TSB") having a width that is a fraction of the width of an SSB 14, and a halftone SB 16 ("HSB"), also known as a dashed-SB. The HSB has the same width as the SSB but is broken into dashes using a halftone screen.

In a crowded space between features 18, the optical weight is directly proportional to the SB width. Accordingly, by reducing the width of the TSB, it is possible to crowd the TSB into a tighter feature space. However the minimum width of the TSB is limited by the mask manufacturing process. In today's leading-edge mask manufacturing processes, the minimum manufacturable TSB width is approximately 0.24 $\mu$m on the reticle (i.e., feature). At 1× wafer scale, this is equivalent to a TSB width of 0.06 $\mu$m. As such, if optical weights below 0.06 $\mu$m are required, the HSB must be employed.

The HSB was developed to circumvent the foregoing mask manufacturing limitation. Since, the HSB can have the same width as the SSB, it is easier to fabricate and inspect the mask. In addition, by adjusting the halftone period of the HSB (as defined below with reference to FIG. 2), the desired optical weight can be obtained. For example, to obtain a 50% optical weight, the halftone period should be 50% (d=s), as shown in FIG. 2.

Halftone Period (HTP)=d+s

For d=s, %H=(d/HTP)*100%=50%

Referring to FIG. 2, by adjusting the size ratio between d and s, we can vary the %H to obtain the desired optical weight relative to the SSB. This HSB method extends the optical weight below the manufacturable minimum width of a solid scattering bar imposed by the mask manufacturing process. For example, using a 0.1 μm SSB width as reference, a 25% HSB is equivalent to a 0.025 μm wide scattering bar. This is far below the current 0.06 μm TSB that is achievable by today's advanced mask manufacturing processes.

While the "feature crowding" OPC method of the Ser. No. 08/808,587 application is effective for CD control in semi-isolated feature situations, it is physically impossible to insert any appropriately-sized SB between features in the semi-dense range. For this type of feature, "biasing" must be utilized in order to compensate for the OPE.

The conventional feature biasing method requires modifying the main feature CD by adding or subtracting a pre-determined amount to or from the main feature. For example, a +0.02 μm overall bias on a 0.18 μm main feature alters the main feature width to be 0.20 μm. For semi-dense features, a bias correction of this type is a satisfactory OPC technique, as long as the mask writing tool can resolve the required amount of bias.

In order to perform such a +0.02 μm fine feature bias on a 4× DUV wafer pattern, a bias of +0.08 μm (i.e., 0.02 μm×4) is required on the reticle. In addition, in order to preserve the pattern symmetry and avoid the positional drift of features, half of this bias amount must be applied to each edge of each candidate feature. The required bias amount per side is then +0.01 μm. At 4×, this is a mere 0.04 μm. To image such a pattern on a raster e-beam mask writing tool would require a 0.04 μm address unit which, while permissible on the latest e-beam machines, nevertheless can require a writing time in excess of 20 hours for a standard six-inch mask. Clearly, such an extended period of time is neither practical nor acceptable from a production view point. A more acceptable production e-beam writing time is on the order of 3 to 6 hours per mask.

Furthermore, using optical laser mask writing tools for such fine feature biasing is not a practical alternative since such tools lack sufficient resolution. Thus, there remains a high cost barrier discouraging the utilization of ultra-fine biasing of features in the semi-dense feature pitch range. Nevertheless, without some form of fine feature biasing for features in the semi-dense feature pitch range, these pitch ranges cannot be permitted in the layout design rules.

As the semiconductor industry begins to employ additional optical resolution enhancement techniques, (such as alternating phase-shift masks), optical lithography is expected to produce minimum feature dimensions near 0.5λ. For such deep sub-λ circuit design rules, semi-dense features (feature pitches between 2λ and 3λ) will become increasingly common. Thus, the semiconductor industry will soon require a practical OPC solution for semi-dense features for leading edge manufacturing processes. It is the object of the present invention to provide a solution to this problem.

SUMMARY OF THE INVENTION

Accordingly, it is an object of the present invention to provide a cost effective and practical method for providing for fine feature biasing for densely and semi-densely packed features so as to compensate for optical proximity effects.

More specifically, the present invention relates to a method for making a mask for optically transferring a lithographic pattern corresponding to an integrated circuit from the mask onto a semiconductor substrate by use of an optical exposure tool. The method comprises the steps of forming a plurality of features corresponding to elements forming the integrated circuit on the mask, and forming a plurality of non-resolvable biasing segments disposed on an edge of at least one of the features.

The present invention also relates to a photolithography mask for optically transferring a lithographic pattern corresponding to an integrated circuit from the mask onto a semiconductor substrate by use of an optical exposure tool. The mask comprises a plurality of features corresponding to elements forming the integrated circuit, and a plurality of non-resolvable biasing segments disposed on an edge of at least one of the features.

As described in detail below, the method and apparatus of the present invention provides important advantages over the prior art. Most importantly, the present invention provides a halftone biasing method which provides for very fine feature sizing without requiring the use of unrealistically small e-beam address units or spot sizes, thereby resulting in a significant cost savings. Indeed, the halftoning biasing method allows for nanometer-scale feature biasing utilizing current mask manufacturing processes so as to allow for OPC treatment in semi-dense and dense feature situations where scattering bars cannot be utilized.

In addition, by applying the novel halftone biasing technique of the present invention asymmetrically to a given feature, it is possible to accomplish micro-position correction so as to compensate for lens-aberration-induced shifts in resist feature positioning.

The asymmetric halftone bias technique ("AHB") is also effective in leveling uneven aerial image intensities that can occur as a result of imbalanced transmissivity between phase-shifting and non-phase-shifting spaces in alternating phase-shift masks ("altPSMs").

Another advantage of AHB is that it can be utilized to modify and/or correct a "grid-snapped" pattern so that it substantially conforms to the originally intended placement.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

DETAILED DESCRIPTION

The following detailed description relates to a novel biasing technique for controlling the feature CD and feature pitch so as to provide OPC for features that are densely and semi-densely packed, as those terms are defined above. This novel biasing technique, which utilizes optical halftoning applied directly to the main feature edges, provides for ultra-fine sizing of the main features.

Figure 1:
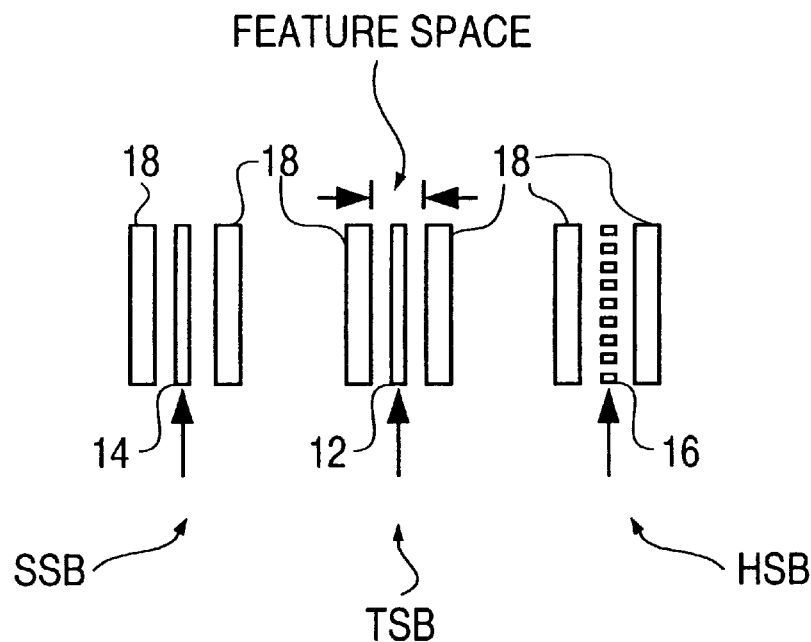
FIG. 1 illustrates the "feature crowding" OPC method utilizing thin scattering bars and halftone scattering bars described in U.S. patent application Ser. No. 08/808,587 now U.S. Pat. No. 5,821,014.
Figure 2:
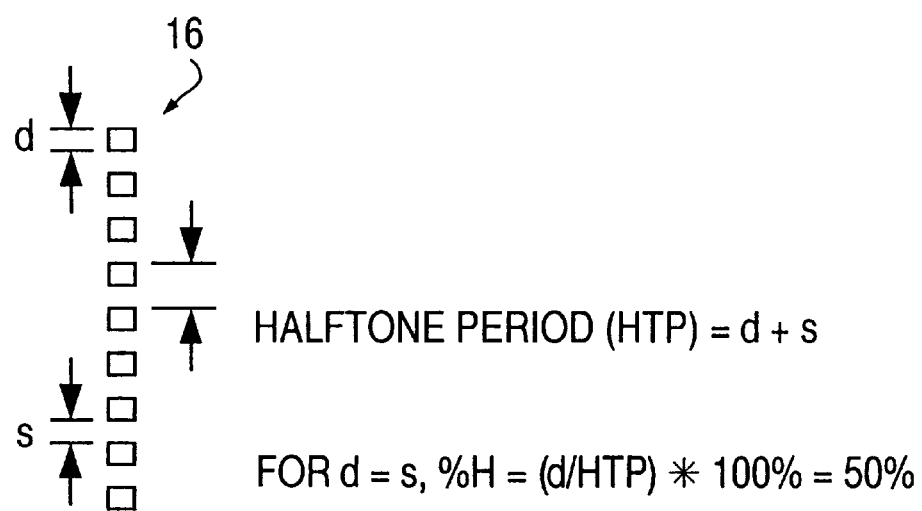
FIG. 2 is a diagram illustrating how the halftone period of a halftone scattering bar, as shown in FIG. 1, is defined.
Figure 3:
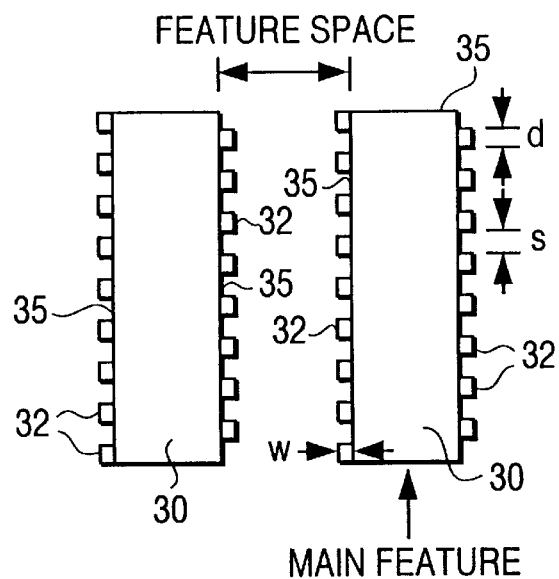
FIG. 3 illustrates an exploded view of a portion of a mask formed utilizing an exemplary embodiment of the halftone biasing technique of the present invention affording a positive bias.

FIG. 3, which is an exploded view of a photolithography mask, illustrates an exemplary embodiment of the application of the present invention. As shown, each feature 30 comprises a plurality of biasing segments 32 disposed along an edge 35 of the given feature 30. In the example of FIG. 3, the biasing segments 32 are disposed along two opposing edges 35 of each feature 30. The biasing segments 32, which form a "tooth-like" pattern along a given edge 35, are depicted as having a substantially square shape. However, in actual implementation it is likely that the biasing segments 32 exhibit a slightly rounded configuration. The dimensions illustrated in FIG. 3 are defined as follows:

d=the length of a given biasing segment, s=the distance between adjacent biasing segment, and w=the width of a given biasing segment.

Typically, w is equivalent to the electron beam spot size used in a raster scan e-beam mask writer. The spot sizes normally used vary from $0.05\mu$ to $0.125\,\mu m$ for a state of the art 4x DUV reticle.

As detailed above, the feature pitch ("FP"), the halftone period ("HTP") and the percentage of halftoning ("%H") of the biasing segments 32 are defined as follows:

FP=feature CD+feature-to-feature space,

HTP=d+s, and

%H=(d/HTP)*100%.

Importantly, in accordance with the present invention the biasing segments 32 must be non-resolvable by the optical exposure tool utilized in the photolithography process. This requires that the halftone period of the biasing segments 32 disposed along any given edge 35 of a feature 30 be kept sub-resolution. In order for the halftone period to be kept sub-resolution, in accordance with Rayleigh's criterion, the following equation must be satisfied:

$$HTP < k1\,(\lambda/NAo),$$

where k1=0.61, $\lambda$ equals the wavelength of the optical exposure source, and NAo equals the numerical aperture of the imaging objective lens of the exposure source.

For example, for a 0.57 NAo KrF excimer laser DUV exposure tool having an exposure wavelength $\lambda$=248 nm, the HTP should be less than $0.25\,\mu m$ at 1x wafer scale (i.e., $0.1\,\mu m$ at 4x reticle scale.) In this example, if the halftone period (HTP) is allowed to exceed 0.25 m, the smoothness of the halftoning degrades, and noticeable waves start to appear along the edges of the features 30.

Figure 4:
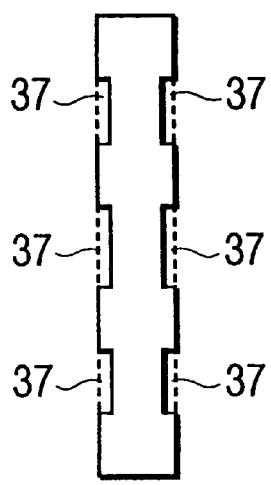
FIG. 4 illustrates an exploded view of a portion of a mask formed utilizing an exemplary embodiment of the halftone biasing technique of the present invention affording a negative bias.

The biasing segments 32 can be applied as external additions to the original features affording a positive bias, or as internal cut-outs along the feature edges, affording a negative bias. FIG. 3 illustrates an example of a positive bias. FIG. 4 illustrates an example of a negative bias. More specifically, as shown in FIG. 4, cut-outs 37 are formed along the feature edges, thereby forming negative biasing segments.

FIG. 3 shows an example of out-of-phase biasing segments, which means that the biasing segments 32 on adjacent edges 35 of a feature 30 (either opposing edges of a given feature or opposing edges of two adjacent features) are not aligned with one another. As seen in FIG. 3, the out-of-phase biasing segments 32 are not aligned in the horizontal direction. It is noted that "out-of-phase" also includes the circumstance when biasing segments are shifted by a half period. In contrast, if the biasing segments 32 of FIG. 3 were in-phase, the biasing segments 32 would be aligned in the horizontal direction. However, as long as the foregoing HTP rule is complied with, both in- and out-of-phase biasing segments 32 will provide equivalent CD results for the same %H.

Table 1 illustrates examples of how the halftone bias can be fine-tuned by adjusting %H (i.e., the ratio between d and s.) In the following examples, the HTP rule is met, fixing HTP at $0.25\,\mu m$ and the width of the halftone biasing segments is $0.020\,\mu m$ per edge. The feature CD is $0.18\,\mu m$, with a feature pitch of $0.54\,\mu m$ (FP=2.18$\lambda$). Exposure conditions comprise a 0.57 NAo KrF laser stepper with illumination $\sigma$=0.80. The DUV resist utilized is Shipley's UV5 ($0.61\,\mu m$ thick) with Shipley's AR2 bottom anti-reflection coating (600 Å thick) on top of a polysilicon substrate.

TABLE 1

| No. | d | s | % H | Resist CD | Bias |
|---|---|---|---|---|---|
| 1 | $0.05\,\mu m$ | $0.20\,\mu m$ | 20% | $0.189\,\mu m$ | $+0.009\,\mu m$ |
| 2 | $0.10\,\mu m$ | $0.15\,\mu m$ | 40% | $0.197\,\mu m$ | $+0.17\,\mu m$ |
| 3 | $0.15\,\mu m$ | $0.10\,\mu m$ | 60% | $0.205\,\mu m$ | $+0.025\,\mu m$ |
| 4 | $0.20\,\mu m$ | $0.05\,\mu m$ | 80% | $0.212\,\mu m$ | $+0.032\,\mu m$ |
| 5 | $0.25\,\mu m$ | $0.00\,\mu m$ | 100% | $0.220\,\mu m$ | $+0.040\,\mu m$ |

As indicated by the results set forth in Table 1, the resulting CD of a feature responds directly to the changes in %H. At 100%H this is equivalent to a total bias of $0.040\,\mu m$. For example, the DUV resist process has been tuned so that the measured resist CD bias is $+0.040\,\mu m$ at 100%H. Thus, by applying the biasing segments of the present invention directly to a given edge of a feature, the present invention provides for fine adjustment of the CD of the feature. Furthermore, as explained in more detail below, it is also possible to apply the biasing segments to a single edge of a feature so as to "adjust" only the single edge of the feature.

Although not all combinations are disclosed herein, as explained above the halftone biasing segments 32 can be applied in either an additive or a subtractive manner (positive halftone bias or negative halftone bias). Examples of a positive halftone bias is set forth in FIG. 3 and Table 1, wherein the biasing segments are utilized to increase the CD of the main feature. In contrast, a negative bias, as shown in FIG. 4, would function to decrease the CD of the main feature. Negative biasing segments are formed in the same manner as positive biasing segments with the exception that as opposed to adding biasing segments to an edge of a feature in the case of positive bias, biasing segments are formed by removing sections along the edge of the feature. In either case, the resulting edge exhibits the "tooth-like" appearance. The biasing segments are also equally applicable to both dark field and clear field masks.

Figure 5:
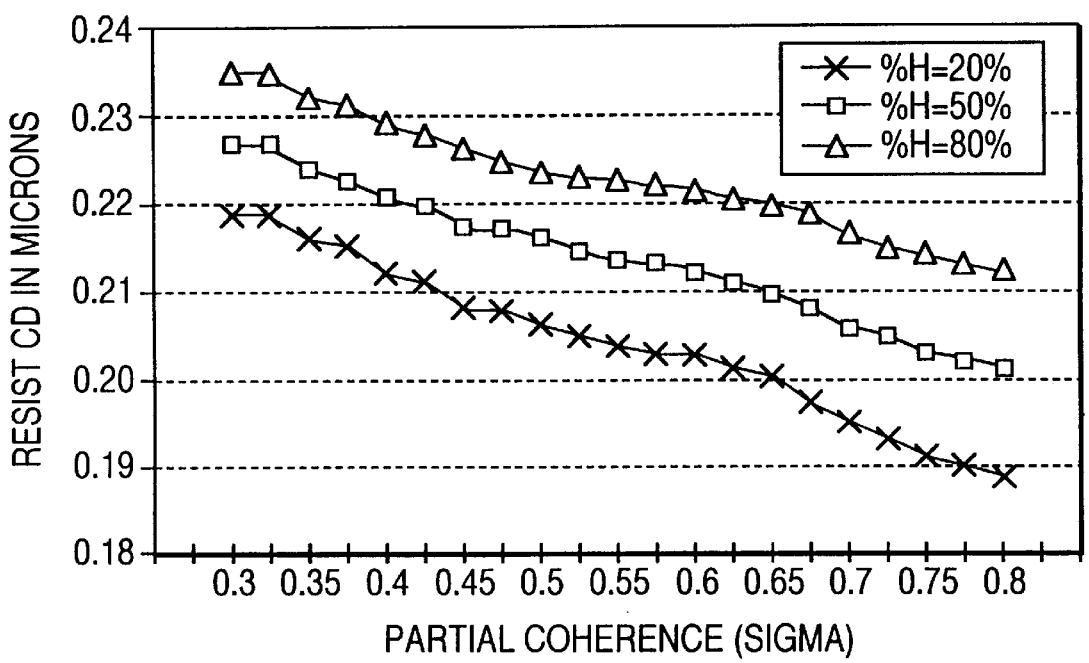
FIG. 5 illustrates experimental results obtained utilizing the present invention to form resist lines.

FIG. 5 illustrates experimental results obtained where the illumination partial coherence (σ) is also varied to influence the final feature CD obtained on resist lines. All three %H levels indicate the same trend, namely, the lower the σ (i.e., more coherent), the higher the CD bias. Refer to Table 1 for the experimental conditions.

The partial coherence effect is also useful for obtaining brighter image intensity through the typical "hole" and "space" patterns on dark-field masks. Higher hole and space CDs are expected with smaller σ. Dark-field features respond predictably to variations in σ and %H, as do clear-field features.

Additionally, FIG. 5 indicates that for a given %H, the actual feature CD measured seems to track linearly with the partial coherence setting. For a lower coherence setting (more coherent illumination), such as 0.3, it will yield a higher CD. On the other hand, the CD will be lower for a higher partial coherence setting (more incoherent illumination). This property can be used for monitoring the actual coherence setting used for wafer printing.

Figure 6:
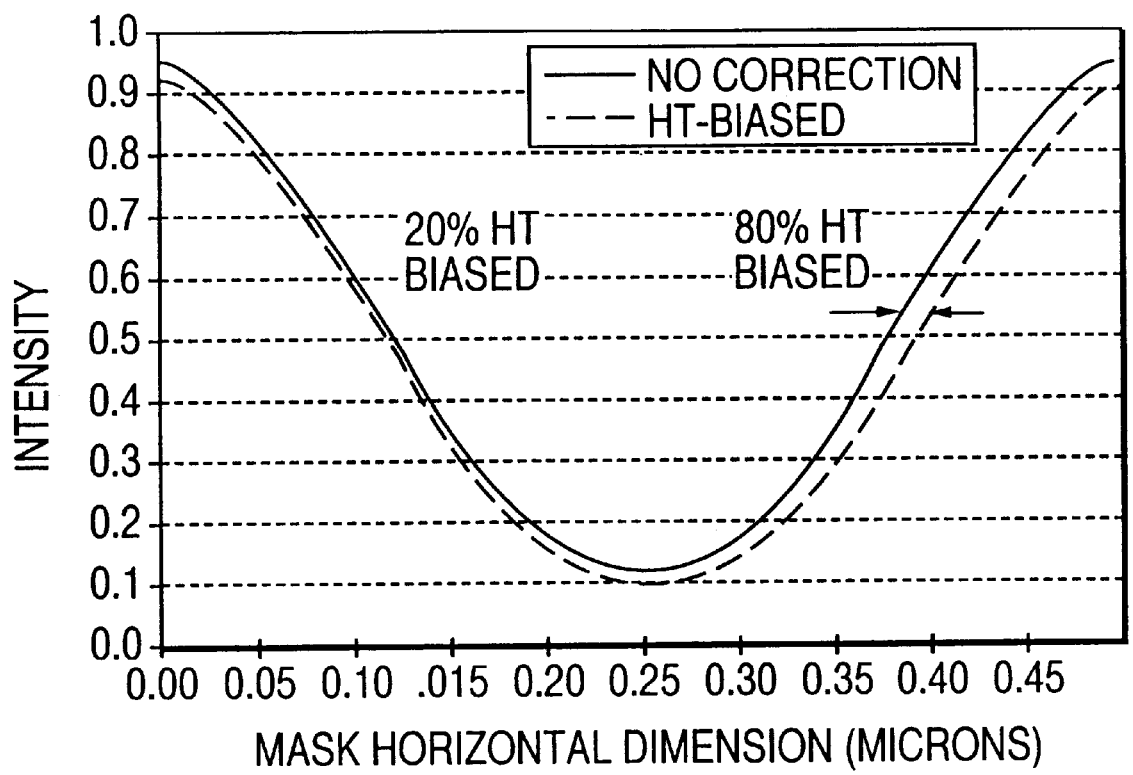
FIG. 6 illustrates the ability to adjust the micro-position of a given feature utilizing an asymmetric halftone bias technique in accordance with the present invention.

It is also possible to fine-tune feature position by applying a different %H to the opposite edges of a feature. For example, if the left edge of a feature receives a 20%H treatment while the right edge of the feature receives a 80%H treatment, the feature's CD will increase, but its centroid will also shift slightly to the right, in effect "micro-positioning" the feature. This effect is illustrated in FIG. 6.

This "micro-positioning" adjustment effect can be utilized to counteract positional shifts due to lens aberrations. For example, for near-diffraction-limited exposure tools such as state-of-the-art KrF excimer laser steppers, an amount of wavefront error close to λ/32 at the lens pupil is conceivable. An X-coma lens aberration of −0.03× (Z7 of Zernike polynomials) is utilized to compute this effect. The same asymmetric halftone bias ("AHB") correction factors as shown in FIG. 6 are utilized. The resulting resist patterns are shown in FIGS. 7(a) and 7(b).

Figure 7A:
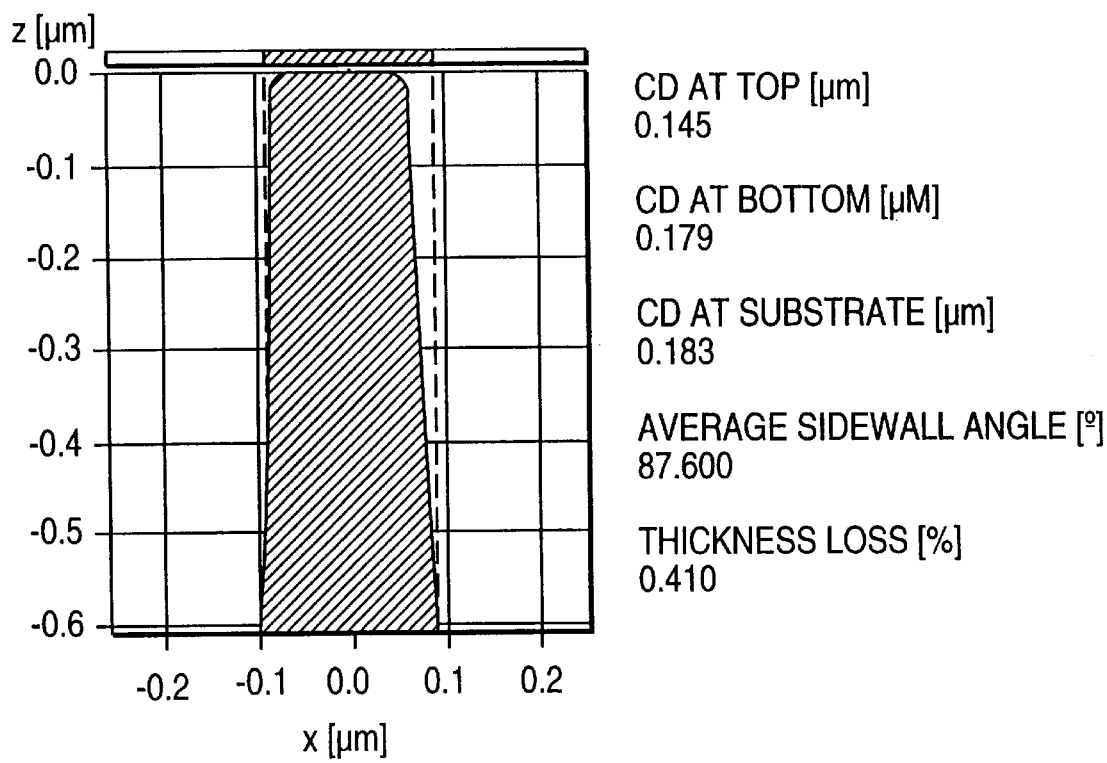
FIGS. 7(a) and 7(b) illustrate the ability to correct for lens aberration utilizing an asymmetric halftone bias technique in accordance with the present invention.
Figure 7B:
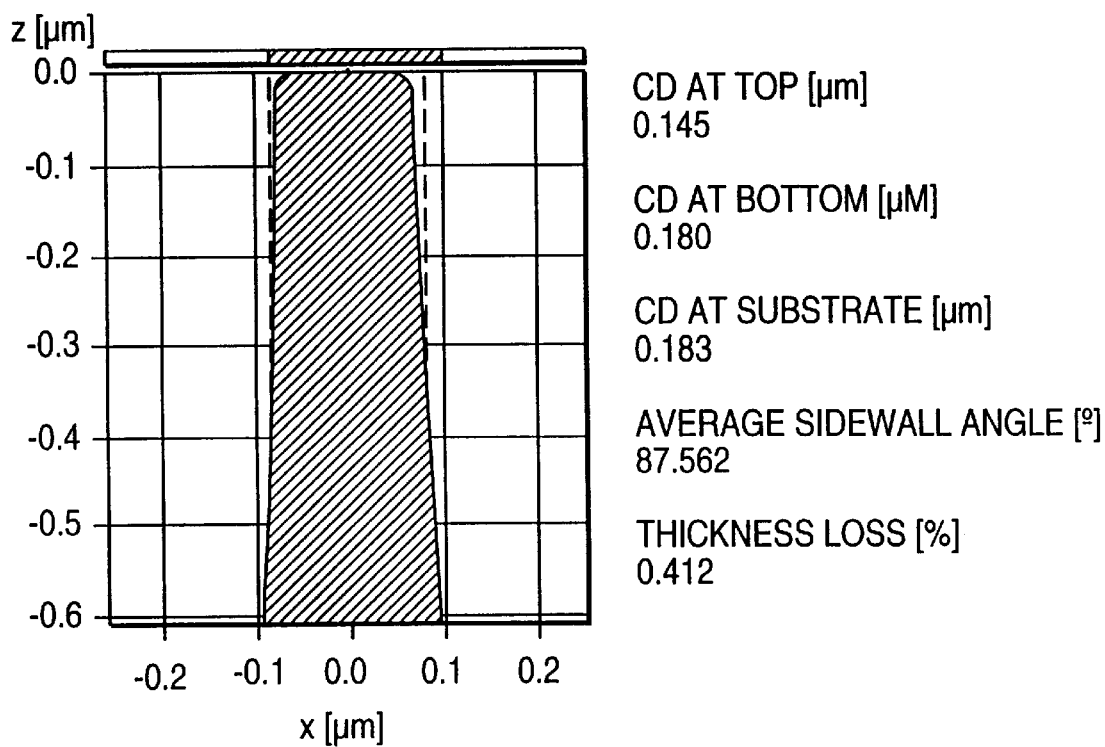

More specifically, FIG. 7(a) illustrates the resulting position of the feature as affected by the lens aberration, without any correction. FIG. 7(b) illustrates a "corrected" feature utilizing the "micro-positioning" adjustment available as a result of the present invention. Indeed, the positioning correction effect is very clearly exhibited in the asymmetrically biased case shown in FIG. 7(b). In this example the use of asymmetric biasing segments functions to correct for the lens aberration by shifting the feature to the right.

Figure 8:
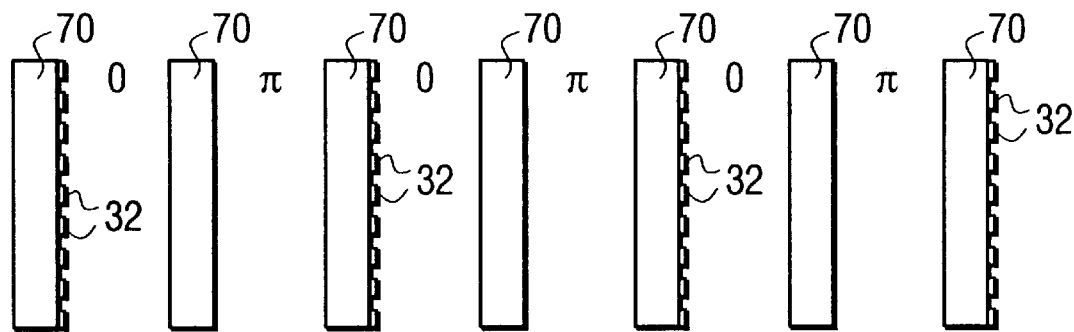
FIG. 8 illustrates an asymmetric halftone bias in accordance with the present invention applied on an altPSM parallel line pattern.

The biasing segments of the present invention can also be utilized to perform intensity leveling for an alternating phase-shift mask ("altPSM"). More specifically, FIG. 8 illustrates an altPSM line pattern having a plurality of main features 70. As shown, the features have biasing segments 32 applied in an asymmetric manner, similar to the application disclosed in conjunction with FIG. 7. The altPSM of FIG. 8 was designed for imaging on a 4× KrF excimer laser exposure tool. In this application, the function of the asymmetric biasing segments is to "level" the intensity differences between 0-degree areas (0-spaces) and π-degree phase shift areas (π-spaces). The intensity delta is known to be caused by transmission loss in the π-space. Ideally the transmission for the 0-spaces and the π-spaces should both be close to 100%. However, since the typical altPSM fabrication procedure involves an etching process for creating the π-spaces, the fabrication process often introduces a measurable amount of transmission loss in the etched areas. Transmission losses in the π-space as high as 10% have been observed. Such unbalanced transmission can cause uneven side-walls for the resist features 70 formed between the 0-spaces and π-spaces. The net effect is undesirable feature CD variations.

In order to correct this problem, a feature bias correction of approximately 40%H (of 0.02 μm) is necessary. (See FIG. 9) This is equivalent to a 0.008 μm edge bias. This degree of bias, which requires a 0.032 μm e-beam address unit, is impractical, even with today's most advanced processes. On the other hand, using the halftone biasing technique of the present invention, this bias can be achieved using a 0.1 μm e-beam address unit on a 4× reticle.

It is noted that in the application of the asymmetric biasing segments applied to the altPSM as shown in FIG. 8, a 40% halftone bias is applied, with w=0.02 μm, d=0.10 μm and HTP=0.25 μm. The biasing segments are applied only to feature edges next to 0-spaces. There is no halftone bias in the π-spaces. The main feature CD is 0.14 μm and the main feature pitch ("FP") is 0.30 μm.

Figure 9:
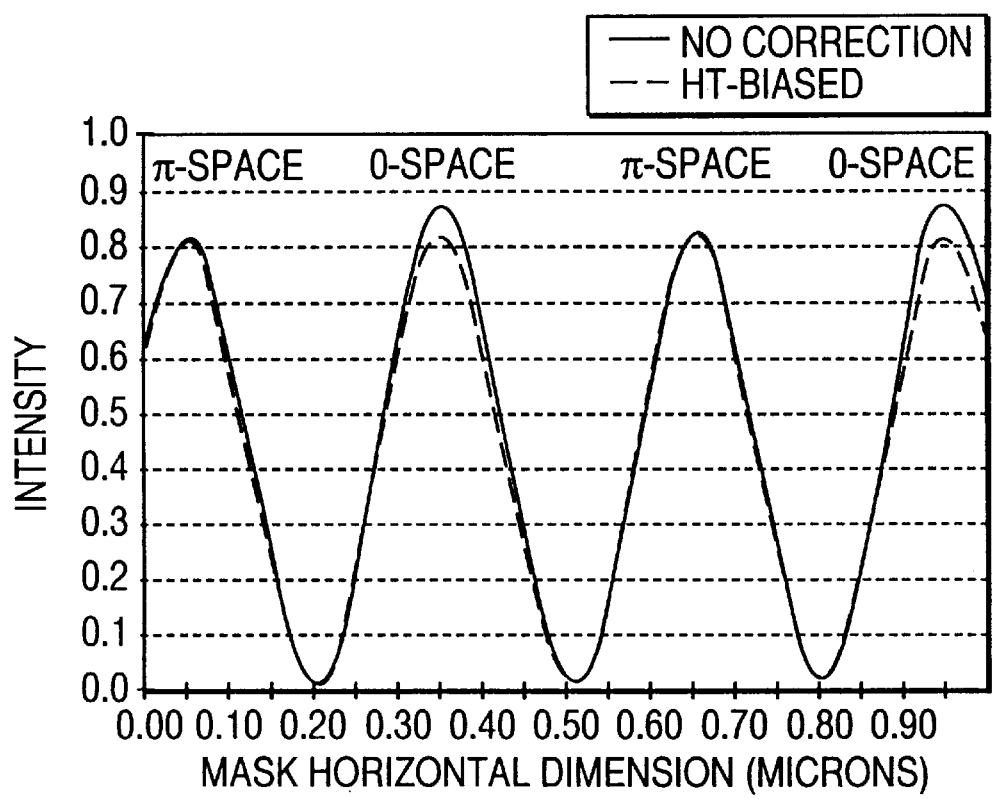
FIG. 9 illustrates the intensity leveling obtained by applying the asymmetric halftone bias shown in FIG. 8 to the altPSM parallel line pattern.

Turning to FIG. 9, it is shown that the application of the asymmetric biasing segments ("AHB") to the altPSM functions to eliminate the intensity variations between the 0-spaces and the π-spaces. It is noted that the foregoing example of intensity leveling by AHB is applicable to dense features (i.e., FP<2λ, where λ for the KrF excimer laser is 0.248 μm). The same AHB method is valid for semi-dense features. For semi-isolated and isolated features, the intensity leveling requirement can be met with scattering bars.

Figure 10:
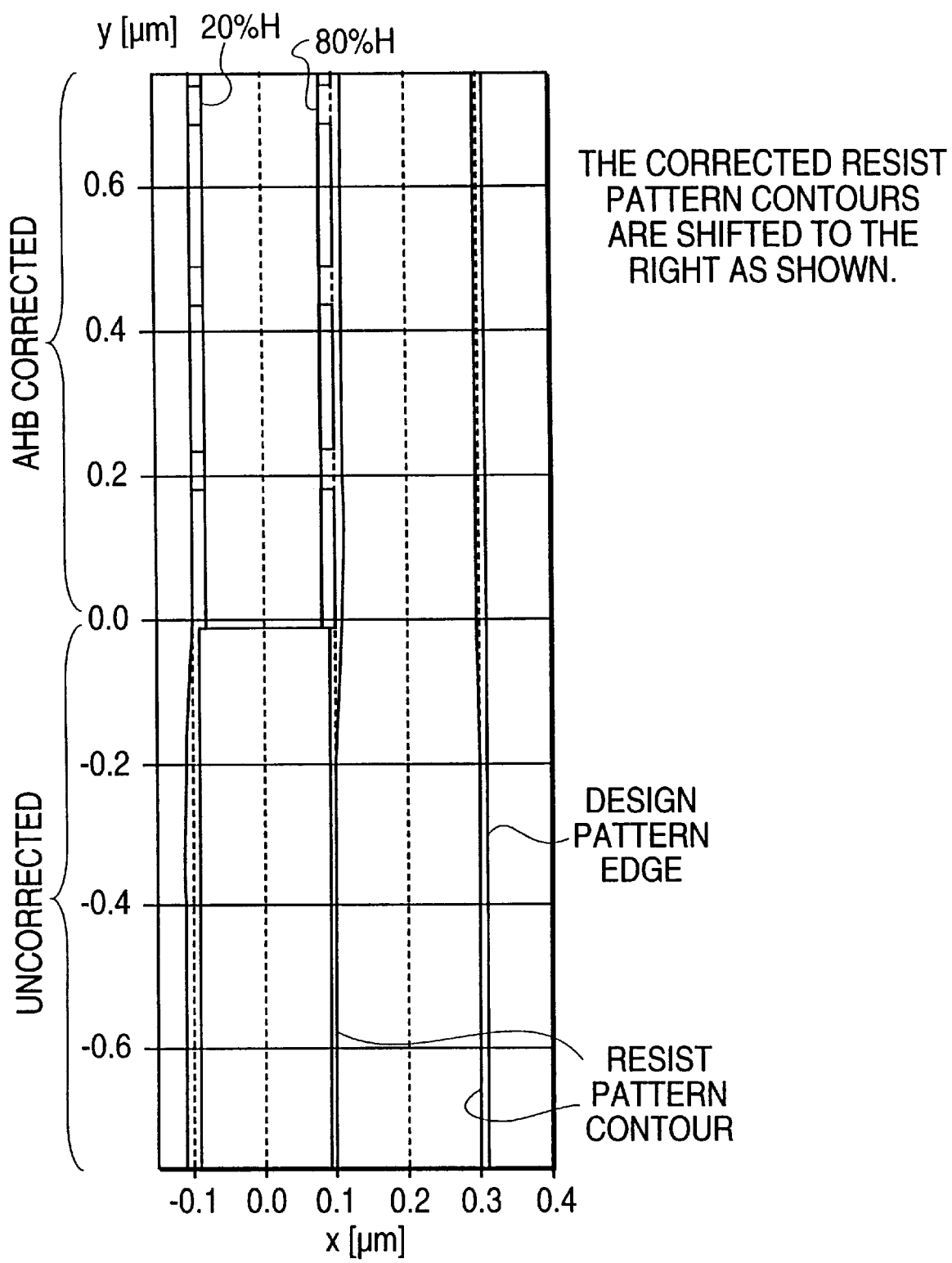
FIG. 10 illustrates the grid-snapping control available utilizing the halftone biasing technique of the present invention.

The AHB technique of the present invention can also be utilized to shift a "grid-snapped" feature to its originally intended placement location. FIG. 10 shows a comparison of AHB biased resist pattern contour versus the uncorrected ("grid-snapped") resist pattern. The grid-snapping occurs when the final e-beam address unit is not a whole multiple of the original drawing grid. Under this situation, the feature edge will be snapped to the nearest multiple grid. This "grid-snapping" can shift the exact placement of the feature away from the intended location. Clearly, for any leading edge IC fabrication, this is not desirable. Using the AHB technique of the present invention as detailed above, it is possible to modify the snapped feature placement to become closer or even resume its original placement without resorting to a smaller e-beam address size. Specifically, asymmetric biasing segments having the necessary %H are applied to the edge of a given feature that has been "snapped" so as to bias the edge back to the intended position.

As described above, the method and apparatus of the present invention provides important advantages over the prior art. Most importantly, the present invention provides a halftone biasing method which provides for very fine feature sizing without requiring the use of unrealistically small e-beam address units or spot sizes, thereby resulting in a significant cost savings. Indeed, the halftoning biasing method of the present invention allows for nanometer-scale feature biasing utilizing current mask manufacturing processes so as allow for OPC treatment in semi-dense and dense feature situations where scattering bars cannot be utilized.

In addition, by applying the novel halftone biasing technique of the present invention asymmetrically to a given feature, it is possible to accomplish micro-position correction so as to compensate for lens-aberration-induced shifts in resist feature positioning.

The asymmetric halftone bias technique (AHB) is also effective in leveling uneven aerial image intensities that can occur as a result of imbalanced transmissivity between phase-shifting and non-phase-shifting spaces in alternating phase-shift masks (altPSMs.)

Another advantage of AHB is that it can be utilized to modify and/or correct a "grid-snapped" pattern so that it substantially conforms to the originally intended placement.

The partial coherence ratio (σ) also interacts with the performance of halftone biased features. As such, with proper tuning, the combination of these effects can be utilized to modulate both clear-field and dark-field feature CDs, or one can use the feature CDs to monitor the partial coherence settings.

Although certain specific embodiments of the present invention have been disclosed, it is noted that the present invention may be embodied in other specific forms without departing from the spirit or essential characteristics thereof. The present embodiments are therefore to be considered in all respects as illustrative and not restrictive, the scope of the invention being indicated by the appended claims rather than the foregoing description, and all changes which come within the meaning and range of equivalency of the claims are therefore intended to be embraced therein.

What is claimed is:

1. A method for making a mask for optically transferring a lithographic pattern corresponding to an integrated circuit from said mask onto a semiconductor substrate by use of an optical exposure tool, said method comprising the steps of:

forming a plurality of features on said mask, said features corresponding to elements forming said integrated circuit, and forming a plurality of non-resolvable biasing segments disposed on an edge of at least one of said features, said plurality of non-resolvable biasing segments disposed on an edge of at least one of said features being substantially equally spaced from one another by a distance—s, each of said plurality of said non-resolvable biasing segments having a predetermined width—w, and a predetermined length—d, said plurality of said non-resolvable biasing segments defining a critical halftone period which equals d+s, wherein said mask is utilized in a photolithography process comprising an exposure source having a wavelength—λ and an imaging objective lens having a numerical aperture—NAo, and said critical halftone period of said non-resolvable biasing segments is less than 0.61 multiplied by (λ/NAo).

2. The method of making a mask according to claim 1, wherein said plurality of features exhibit a feature pitch which is less than 3λ.

3. The method of making a mask according to claim 1, wherein a plurality of said non-resolvable biasing segments are formed on at least two edges of at least one of said plurality of features.

4. The method of making a mask according to claim 1, wherein a plurality of said non-resolvable biasing segments are formed on at least two edges of a plurality of said features.

5. A photolithography mask for optically transferring a lithographic pattern corresponding to an integrated circuit from said mask onto a semiconductor substrate by use of an optical exposure tool, said mask comprising:

a plurality of features corresponding to elements forming said integrated circuit, and a plurality of non-resolvable biasing segments disposed on an edge of at least one of said features, said plurality of non-resolvable biasing segments disposed on an edge of at least one of said features being substantially equally spaced from one another by a distance—s, each of said plurality of said non-resolvable biasing segments having a predetermined width—w, and a predetermined length—d, said plurality of said non-resolvable biasing segments defining a critical halftone period which equals d+s, wherein said mask is utilized in a photolithography process comprising an exposure source having a wavelength—λ and an imaging objective lens having a numerical aperture—NAo, and said critical halftone period of said non-resolvable biasing segments is less than 0.61 multiplied by (λ/NAo).

6. The photolithography mask according to claim 5, wherein said plurality of features exhibit a feature pitch which is less than 3λ.

7. The photolithography mask according to claim 5, wherein a plurality of said non-resolvable biasing segments are formed on at least two edges of at least one of said plurality of features.

8. The photolithography mask according to claim 5, wherein a plurality of said non-resolvable biasing segments are formed on at least two edges of a plurality of said features.

9. The photolithography mask according to claim 5, wherein the amount of bias exhibited by a given edge of a feature is variable by adjusting the ratio between d and s exhibited by the plurality of non-resolvable bias segments disposed on said given edge.

* * * * *